(12) United States Patent
Feucht et al.

(10) Patent No.: US 11,262,396 B2
(45) Date of Patent: Mar. 1, 2022

(54) FUNCTIONAL TESTER FOR PRINTED CIRCUIT BOARDS, AND ASSOCIATED SYSTEMS AND METHODS

(71) Applicant: CheckSum, LLC, Arlington, WA (US)

(72) Inventors: Jonathan Allen Feucht, Arlington, WA (US); Peter Andrew Pias, Marysville, WA (US); Daniel Benjamin Carson, Arlington, WA (US)

(73) Assignee: CHECKSUM, LLC, Arlington, WA (US)

( * ) Notice: Subject to any disclaimer, the term of this patent is extended or adjusted under 35 U.S.C. 154(b) by 137 days.

(21) Appl. No.: 16/485,149

(22) PCT Filed: Feb. 9, 2018

(86) PCT No.: PCT/US2018/017550
§ 371 (c)(1),
(2) Date: Aug. 9, 2019

(87) PCT Pub. No.: WO2018/148497
PCT Pub. Date: Aug. 16, 2018

(65) Prior Publication Data
US 2020/0033396 A1    Jan. 30, 2020

Related U.S. Application Data

(60) Provisional application No. 62/457,593, filed on Feb. 10, 2017.

(51) Int. Cl.
*G01R 31/28* (2006.01)
*G01R 31/317* (2006.01)
*G01R 31/319* (2006.01)

(52) U.S. Cl.
CPC ... *G01R 31/2806* (2013.01); *G01R 31/31701* (2013.01); *G01R 31/31907* (2013.01)

(58) Field of Classification Search
CPC ............... G01R 31/28; G01R 31/2806; G01R 31/2808; G01R 31/31701; G01R 31/3183;
(Continued)

(56) References Cited

U.S. PATENT DOCUMENTS 4,807,161 A * 2/1989 Comfort ............ G01R 31/2637
                                                                  702/121
5,032,789 A    7/1991 Firooz et al.
(Continued)

FOREIGN PATENT DOCUMENTS

EP    0526922 A2    2/1993
EP    2341353 A1    7/2011

OTHER PUBLICATIONS

Extended European Search Report, dated Jul. 16, 2020, issued in corresponding European Application No. 18751402.1, filed Feb. 9, 2018, 12 pages.
(Continued)

*Primary Examiner* — Thang X Le
(74) *Attorney, Agent, or Firm* — Christensen O'Connor Johnson Kindness PLLC

(57) ABSTRACT

Systems and methods for testing printed circuit boards (PCBs) are disclosed herein. In one embodiment, a tester for printed circuit boards (PCBs) includes a test fixture having a plurality of electrical contacts for contacting the PCBs that are units under test (UUTs). The test fixture carries a remote test peripheral master (RTPM) module, and a remote test peripheral slave (RTPS) module. The RTPM module and the RTPS module are connected through a remote test peripheral (RTP) bus.

23 Claims, 13 Drawing Sheets

(58) Field of Classification Search
CPC ............ G01R 31/319; G01R 31/31907; G01R 31/3193
See application file for complete search history.

(56) References Cited

U.S. PATENT DOCUMENTS

| | | | | |
|---|---|---|---|---|
| 5,216,361 | A * | 6/1993 | Akar | G01R 1/07371 324/72.5 |
| 5,343,478 | A * | 8/1994 | James | G01R 31/318552 714/30 |
| 6,530,048 | B1 * | 3/2003 | Yeh | G06F 11/24 714/724 |
| 6,717,541 | B1 * | 4/2004 | Carter-Lewis | G01D 1/18 341/144 |
| 6,868,513 | B1 * | 3/2005 | Botala | G01R 31/31912 702/118 |
| 6,968,545 | B1 * | 11/2005 | Krech, Jr. | G01R 31/31926 712/234 |
| 7,139,949 | B1 | 11/2006 | Jennion et al. | |
| 7,345,495 | B2 * | 3/2008 | Dangelo | G01R 31/2863 324/750.06 |
| 2002/0035658 | A1 * | 3/2002 | Whetsei | G01R 31/318563 710/300 |
| 2003/0016039 | A1 * | 1/2003 | Williams | G01R 1/07328 324/755.05 |
| 2006/0107160 | A1 * | 5/2006 | Ricchetti | G11C 29/56 714/742 |
| 2007/0024308 | A1 | 2/2007 | Azimi et al. | |
| 2008/0157805 | A1 * | 7/2008 | Kushnick | G01R 31/31907 324/750.01 |
| 2014/0306728 | A1 | 10/2014 | Arena et al. | |
| 2016/0210253 | A1 * | 7/2016 | Matt | G06F 13/4068 |
| 2018/0143889 | A1 * | 5/2018 | Petkof | G06F 11/2236 |

OTHER PUBLICATIONS

International Search Report and Written Opinion, dated May 4, 2018, issued in priority International Application No. PCT/US2018/017550, filed Feb. 9, 2018.

* cited by examiner

DETAIL A

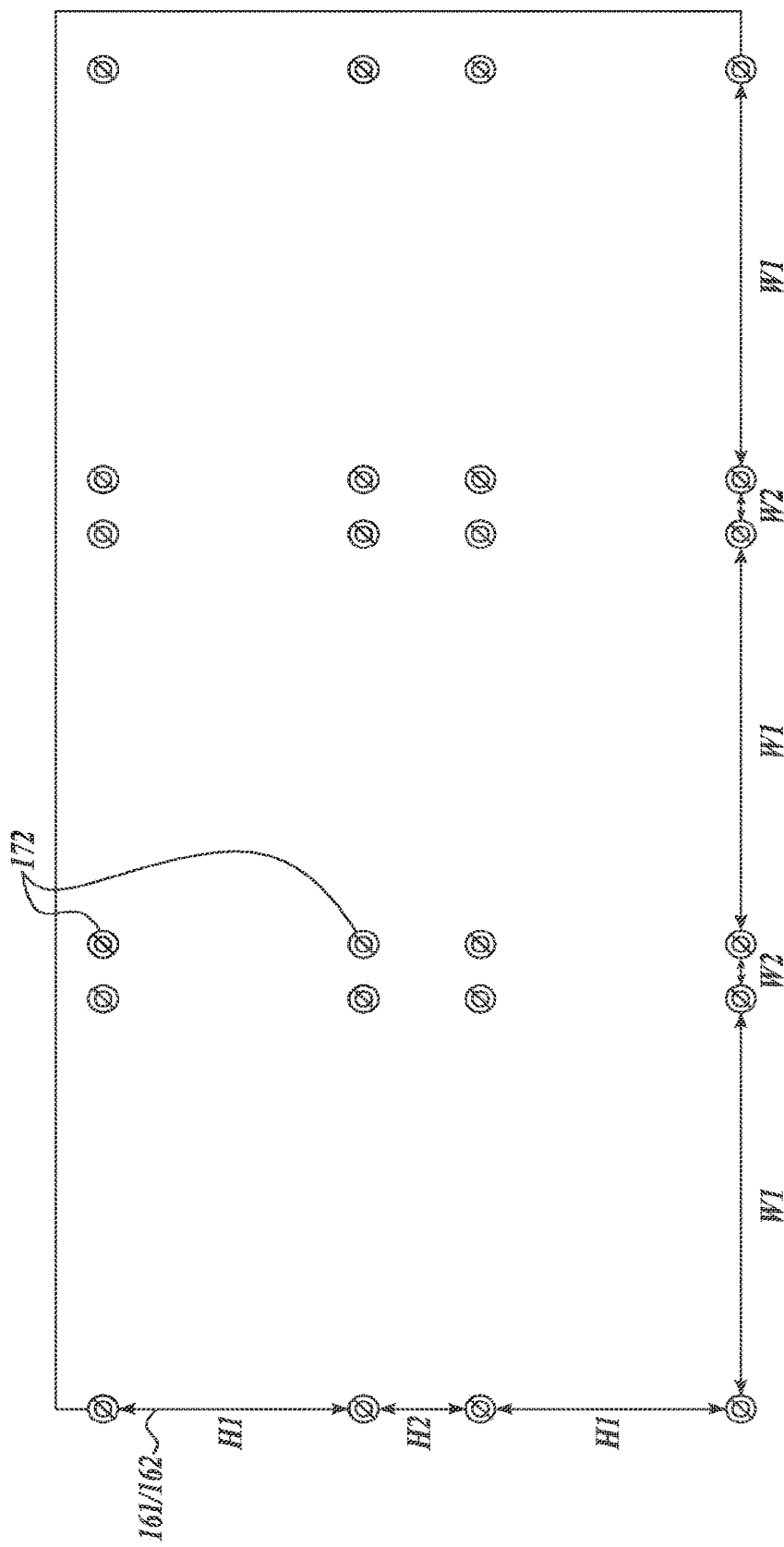

FUNCTIONAL TESTER FOR PRINTED CIRCUIT BOARDS, AND ASSOCIATED SYSTEMS AND METHODS

CROSS-REFERENCE TO RELATED APPLICATION

This application is a national phase application under Sec. 371 of International Application No. PCT/US2018/017550, filed Feb. 9, 2018, which claims priority to U.S. Provisional Application No. 62/457,593, filed Feb. 10, 2017, which disclosures are incorporated herein by reference.

BACKGROUND

Printed circuit boards (PCBs) are tested before being shipped to customers. PCBs typically include internal routing (traces) distributed over several metallization layers. The horizontal metallization layers are electrically interconnected by vertical vias. Electrical components (resistors, capacitors, integrated circuits (ICs), connectors, etc.) are attached to pads at the surface of the PCB or to the metallization of through-holes extending vertically through the thickness of the PCB. These electrical components are interconnected by the traces of the PCB. The external connections of the PCB are typically edge connectors or other connectors carried by the PCB.

The PCB and the electrical components are sometimes collectively called a printed circuit board assembly (PCBA). Generally, the terms PCB and PCBA are used interchangeably, i.e., the term PCB can denote the board itself, as well as an assembly of the board and the electrical components that are carried by the board.

Testing of the PCBs (or the PCBAs) can be in-circuit (in-circuit test or ICT) or functional (functional test or FT). In-circuit test performs a "schematic verification" by testing individual components of the PCB one at a time. For example, resistance, voltage drop, polarity, etc., of the individual electrical components are measured and compared against expected values for that component. Typically, the in-circuit test is not done "at speed," and does not verify interoperability of the electrical components. However, the in-circuit test can still be effective in finding manufacturing defects of the PCB, the electrical components, or the defects in the attachment of the components to the PCB. For example, the in-circuit test may detect solder shorts, missing components, wrong components, improperly attached components (e.g., a diode that is rotated 180°), or open connections. Most of the in-circuit tests are performed without the PCB being powered, thus avoiding the conditions that could damage components. Test programming effort can be minimized as the programming consists of switching the test instruments to connect to the PCB via a bed-of-nails (BON) fixture.

Functional testing is designed to assure that circuitry functions within the specifications. Such testing may be done "at speed" through the PCB connectors (e.g., edge connectors on the PCB) and/or the BON fixture. Functional tests can identify functional defects within the PCB as well as the defects in the components. For example, functional test may assess functionality of the PCB while applying marginal power supply voltage and/or current to an IC to assess functionality of the IC, may determine power consumption of the PCB or a component on the PCB during operation, may test operation of the components at their specification frequency, etc.

However, the test programs for functional test require a thorough understanding of the device under test (DUT) performance, thus programming costs are typically higher than those for the in-circuit test. Furthermore, with conventional BON systems, the programming has to be repeated for every new PCB design, because the pins of the BON (e.g., pogo pins) are wired back to the corresponding pins of the instruments in the PCB testers, and the instruments must be reprogrammed for the next PCB design. Additionally, some high frequency tests may not be possible due to relatively large distance from the instruments in the PCB tester to the PCB under test (also referred to as "unit under test" or UUT). This relatively large distance may cause significant attenuation of the signals in the cables that run from the mainframe to the UUT. Accordingly, systems and methods for improved in-circuit test and functional test are needed.

DESCRIPTION OF THE DRAWINGS

The foregoing aspects and many of the attendant advantages of the inventive technology will become more readily appreciated and better understood by reference to the following detailed description, when taken in conjunction with the accompanying drawings, wherein:

FIG. 4D is a schematic view of RTP module mounting holes in accordance with an embodiment of the present technology;

DETAILED DESCRIPTION

Specific details of several embodiments of the PCB testers are disclosed herein. The inventive technology relates to PCB testers that are configurable, and can perform functional tests on multiple PCBs in parallel. More particularly, the present technology relates to PCB testers that are configurable, and can perform both in-circuit test (ICT) and functional test (FT) on multiple PCBs in parallel. A significant portion of the test electronics may be located on the test fixture itself (i.e., close to the PCBs under test, also referred to as units under test or UUTs). As a result, signal/power path to the UUTs is shortened. In some embodiments, the tester may test multiple PCBs in parallel. These PCBs may have different configurations (e.g., different designs).

In some embodiments, the test electronics may be distributed over master/slave modules (also referred to as remote test peripherals or RTPs). Several RTP master/slave module chains may be connected through USB link or other fast serial link to an universal serial bus (USB) hub, and further to a host controller (i.e., a computer or a server). The RTP master/server modules (RTPM/RTPS) in the chain can communicate through a serial link, for example, an 8-bit asynchronous serial link. The RTPM/RTPS module chains can be reconfigured or reprogrammed depending on the configuration and number of the UUTs tested in parallel, without having to replace the RTPM/RTPS modules.

In some embodiments, the test fixture is "self-aware," i.e., capable of reporting its configuration back to the control system. For example, the test fixture may report configuration of the RTP master/slave modules, number of the boards, assignments of the pin contacts, revision number of the master/slave module, etc.

In some embodiments, the test program (also referred to as a test sequence) is loaded directly on the test fixture. For example, the test fixture may include memory chips for storing the test program and data files having the test point assignments.

A person skilled in the art will also understand that the technology may have additional embodiments, and that the technology may be practiced without several of the details of the embodiments described below.

Figure 1:
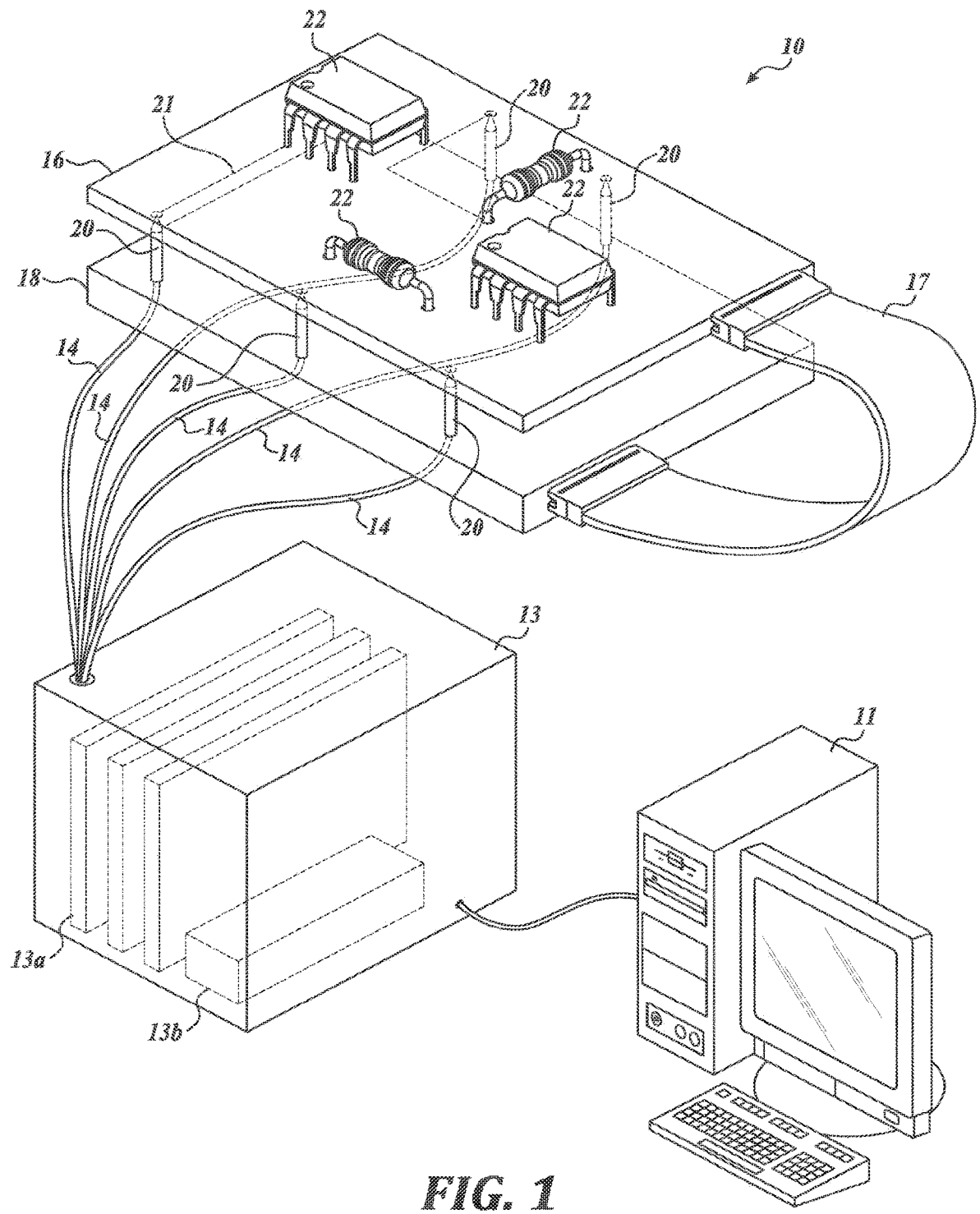
FIG. 1 is a partially schematic, isometric view of a PCB tester in accordance with prior art.

FIG. 1 is a partially schematic, isometric view of a PCB tester 10 in accordance with prior art. The PCB tester 10 includes a mainframe 13 and a test fixture 18. The conventional test fixture is typically built as a mechanical "bed of nails" (BON) fixture that is specifically designed for a particular layout of the UUT. The mainframe 13 includes electronics that sends test vectors and power to a UUT 16. For example, the mainframe 13 can include test instruments 13a for checking open/shorts on the UUT 16, and a power supply 13b for powering components 22 on the UUT 16.

The test fixture 18 includes contact pins 20 (e.g., pogo pins) that electrically connect electronics in the mainframe 13 with traces 21, and further with components 22 of the UUT 16. Additional electrical connectivity between the test fixture 20 and the UUT 16 is provided through a cable 17.

Test cables 14 connect the test instruments and power supplies of the mainframe 13 with the test fixture 18. A host computer 11 controls the operation of the mainframe 13 (e.g., sending the test vectors through the cables 14) and interprets the results of the test (e.g., presence/absence of defective components on the UUT 16). However, a relatively long length of the test cables 14 can degrade signal integrity due to noise and transmission line effects, especially for the high frequency testing.

Figure 2:
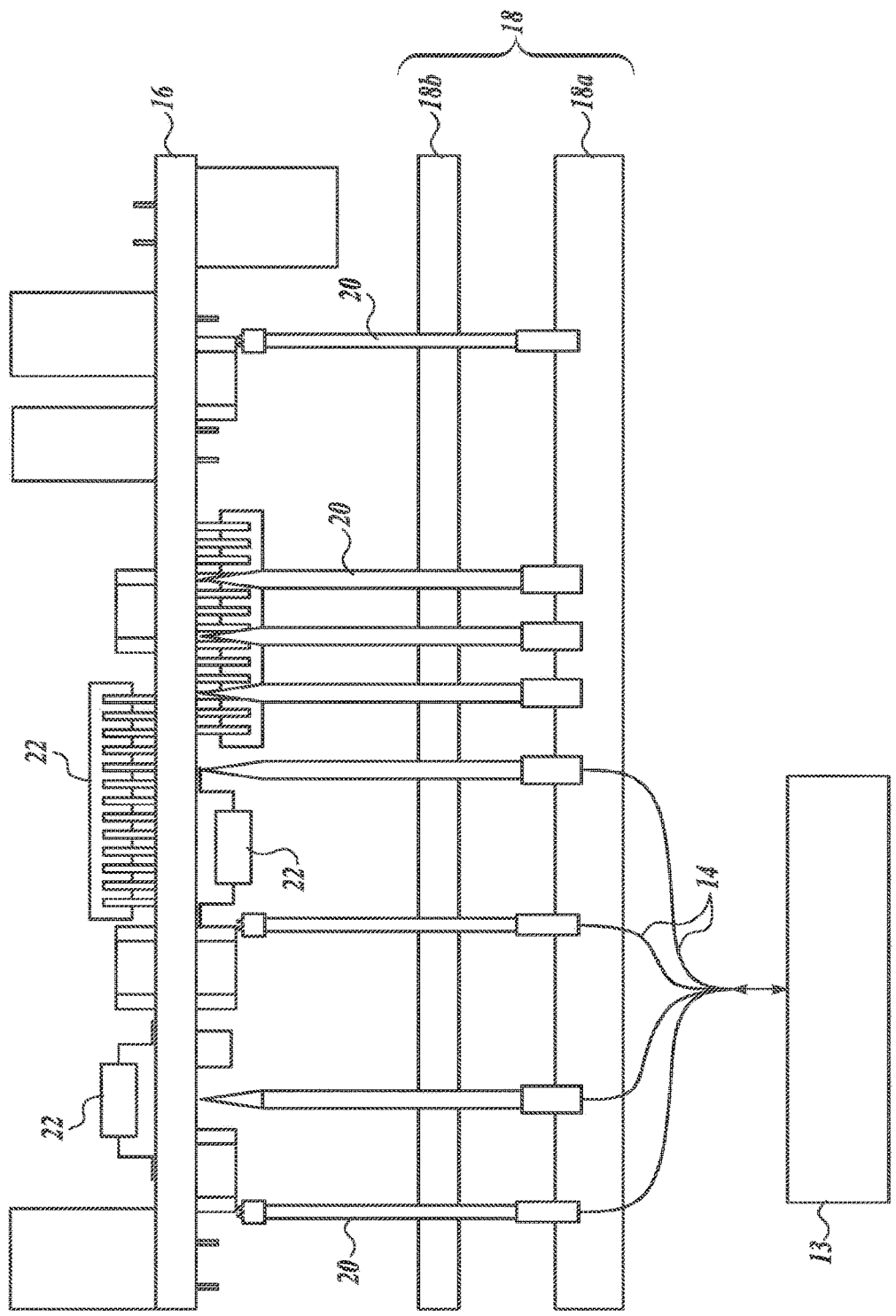
FIG. 2 is a partially schematic view of a test fixture in accordance with prior art.

FIG. 2 is a partially schematic view of a test fixture in accordance with prior art. The test fixture 18 can include an assembly of plates 18a and 18b for improved vertical alignment of the contact pins 20. The mainframe tester 13 provides test vectors and/or power through test cables 14. In operation, the contact pins 20 make contact with the components 22 or the traces of the UUT 16 to provide electrical connectivity to/from the mainframe tester 13. After completing the testing of the UUT 16, the tested UUT is removed and the next UUT is loaded to make contact with the test fixture 18.

Figure 3:
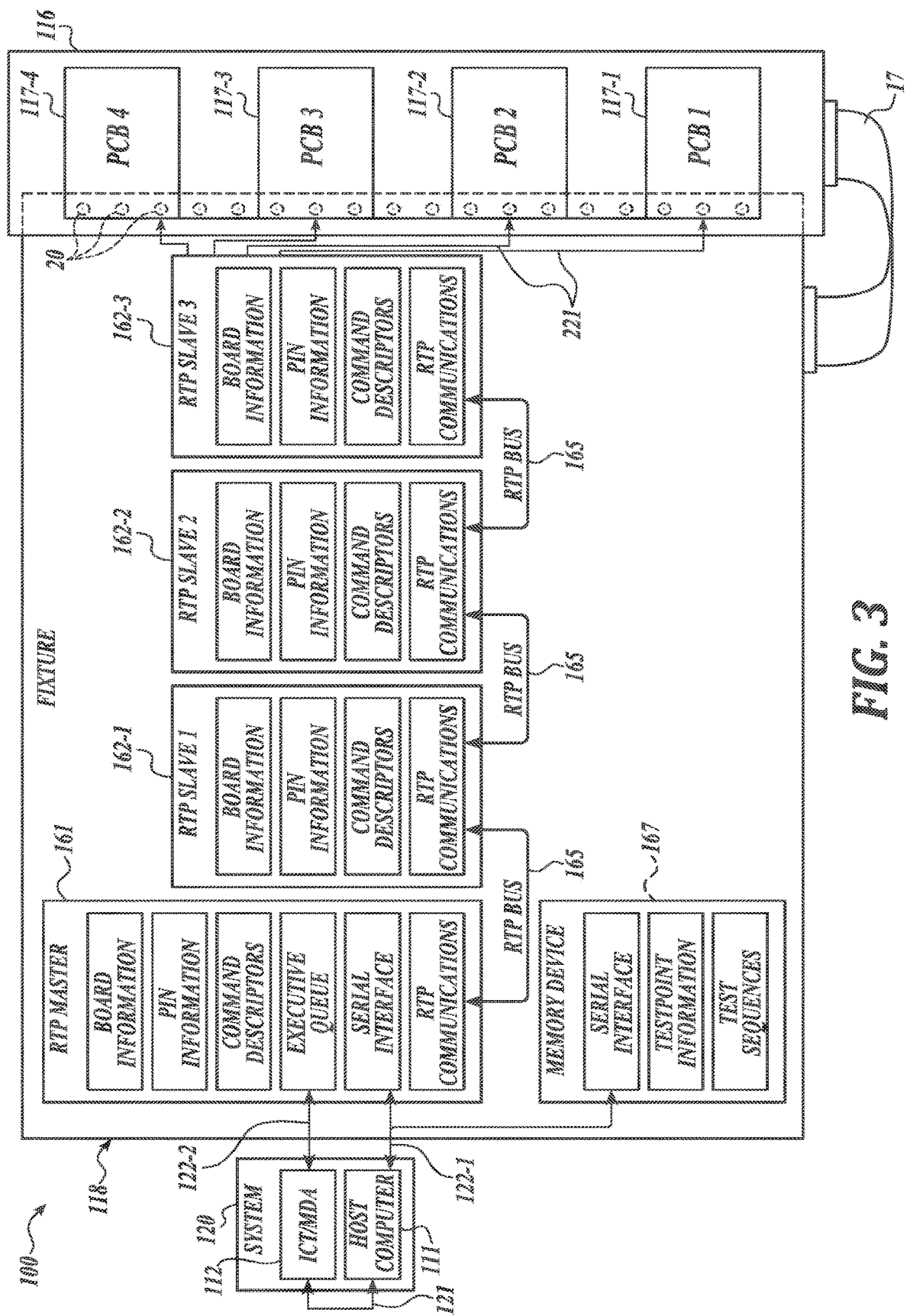
FIG. 3 is a block diagram of a PCB tester in accordance with an embodiment of the present technology.

FIG. 3 is a block diagram of a PCB tester 100 in accordance with an embodiment of the present technology. The PCB tester 100 includes a test fixture 118 and a control system 120.

In some embodiments, the control system 120 includes an ICT (in-circuit tester)/MDA (manufacturing defects analyzer) 112 and a host computer (host controller) 111. The control system 120 may also be referred to as the ICT/MDA system 120. A host computer 111 provides an operator interface for communicating with the ICT/MDA system 120 through a bus 121, which may be a USB connection or other high speed serial bus.

The test fixture 118 can be connected with the control system 120 through one or more high speed serial buses 122, for example USB buses. In addition to the control/test signals received from the control system 120, the test fixture 118 may generate test signals and power for functional test (FT) of the UUTs 117 through one or more RTPM/RTPS chains 161/162 carried by the test fixture. The test fixture 118 can be connected to a UUT panel 116, which includes one or more PCBs 117 (UUTs 117).

In operation, the ICT may, for example, detect opens/shorts on the UUTs 117, and the MDA may evaluate manufacturing defects of the UUTs 117. Some examples of the ICT tests in combination with the functional test (FT) are described below.

RTPM/RTPS Chains Carried by the Test Fixture

In some embodiments, much of the electronics for the functional test (FT) resides within the test fixture 118, therefore minimizing the number of test cards in the control system 120. The FT hardware of the test fixture 118 can include one or more RTP master (RTPM) modules 161, each controlling one or more RTP slave (RTPS) modules 162-i. The RTPS modules can perform a variety of tasks including, for example, power regulation, load switching, current/voltage sensing, UCT (universal counter/timer), logic analysis/playback, LED optical testing, RF (radio frequency) testing, HIPOT (high potential) testing, relay control, and customer-specific functions.

Furthermore, the RTP bus 165 (for example, a universal asynchronous receiver-transmitter or UART) can support a relatively simple addition of the RTPS module, therefore enabling expansion of the functional tests as required by different number of UUTs 117 from one test to another. In many embodiments, the number of RTPM/RTPS chains and the composition of the RTPS modules can be changed to suit a specific test or a specific UUT. As a result, the tester is modular, scalable and customizable.

In some embodiments, RTPM/RTPS modules are programmable. Therefore, the modules can be reconfigured to test different UUTs (through, for example, Command Descriptors and Pin Information) or reprogrammed with different firmware without replacing the RTPM/RTPS modules. Furthermore, since the RTPM/RTPS modules are carried by the test fixture 118, changes of the control system 120 can be minimized for different configurations/numbers of the UUTs 117.

In operation, the RTPS modules can communicate with UUTs through buses 221, e.g., CAN (controller area network), LIN (local interconnect network), $I^2C$ (inter integrated circuit), $I^2S$ (inter integrated sound), JTAG (join test action group), SPI (serial parallel interface), UART (universal asynchronous receiver-transmitter), etc. Stated differently, the RTPM module establishes a control channel over the RTPS module through the RTP bus 165. These bus communication protocols can support a variety of RTPMs/RTPSs having different test capabilities. Generally, the UUTs 117 that are being tested in parallel have the same design. However, in some embodiments, the UUTs having different designs may be tested simultaneously through a single fixture by differently programming the RTPM/RTPS modules that interface with different UUT designs.

In many embodiments, tester quoting process is simplified for the tester that has modular RTPM/RTPS design. For example, the test fixture 118 that carries standardized RTPM/RTPS modules 161/162 is generally easier to quote than a custom-designed test fixture 118 having the same capability. Furthermore, quoting the test fixture 118 that carries standardized RTPM/RTPS modules 161/162 can be more precise.

Test Program and Test Pin Assignments Pre-Loaded on Test Fixture

Conventional FT systems reserve a block of testpoint numbers which may not correspond to the testpoint numbers that the tester instruments are actually connected to. Therefore, additional knowledge is required to connect the wires of the tester to the testpoints of the UUTs. In some embodiments of the inventive technology, the testpoint information may be stored with the test program (the test sequence) directly on the test fixture 118, for example, on a memory storage device 167 (e.g., flash memory, EPROM, etc.) of the test fixture 118. The testpoint information may be used for the functional test programs and to simplify wiring of the fixture 118. The testpoint information may assist with auto-generation of a netlist template, which the user can use to fill in appropriate testpoint information for the fixture. Furthermore, the testpoint information can be used for generating wiring instructions, fixture hardware diagrams and/or for self-test of the RTPM/RTPS modules on the test fixture.

In some embodiments, the UUTs 117 are tested in less time because the communication between the control system 120 and the test fixture 118 is minimized (e.g., no need to transfer the listings of the testpoints from the control system 120 to the test fixture 118). In operation, the test results may be aggregated for several UUTs 117, and then collectively sent to the control system 120 over the high speed serial bus 122 to further minimize data transfers between the control system and the test fixture.

Self-Aware Test Fixture

In some embodiments, the RTPM module 161 can perform a system query to, for example, determine the number and type of the RTPS modules 162 in the RTP fixture. The system query may also determine particular addresses of the RTPM/RTPS modules, and the corresponding features that specific RTPM/RTPS module support. These capabilities enable the test fixture to be self-aware.

In some embodiments, the RTPS modules 162 also include commands. For example, an RTPS module 162 may include a default set of commands, which can be used for querying information pertaining to each module (e.g., board information, pin information, command descriptions, etc.), therefore allowing the RTP fixture 118 to be self-discoverable. For example, information stored in RTPS modules 162 may allow the user or other modules 161/162 to:

- download board information (part number, revisions, descriptions);
- download information related to number of channels supported by the RTPS module, and
- download information about the supported features and commands. This information may provide full command descriptors, and may be sufficient for the user to know the required parameters, expected return values, and the effects of any command supported by the RTP module. Furthermore, the information may be used by the control system 120 to display to the operator the appropriate graphical interface for setting up RTP tests.

Self-Diagnostics of RTPM/RTPS Modules

In some embodiments, the RTPM module 161 and/or RTPS module 162 may carry hardware that enables the microcontroller to perform self-test diagnostic tests of on-board circuitry to detect issues with the RTPM/RTPS modules (e.g., erroneous wiring, hardware failures, power issues, etc.). Some examples of self-tests executed by the RTPS module 162 are:

- on-board diagnostic programs. Software may be provided which allows the microcontroller to detect problems on the RTPM/RTPS without external help;
- user-coordinated diagnostic programs. These self-test programs may require the assistance of an operator to provide a stimulus to a testpoint using a ground probe or some other tool; and
- ICT/MDA-coordinated diagnostic programs. The ICT/MDA may either provide stimulus to the outputs of the RTPS module, or take measurements of the RTPS module outputs.

Figure 4A:
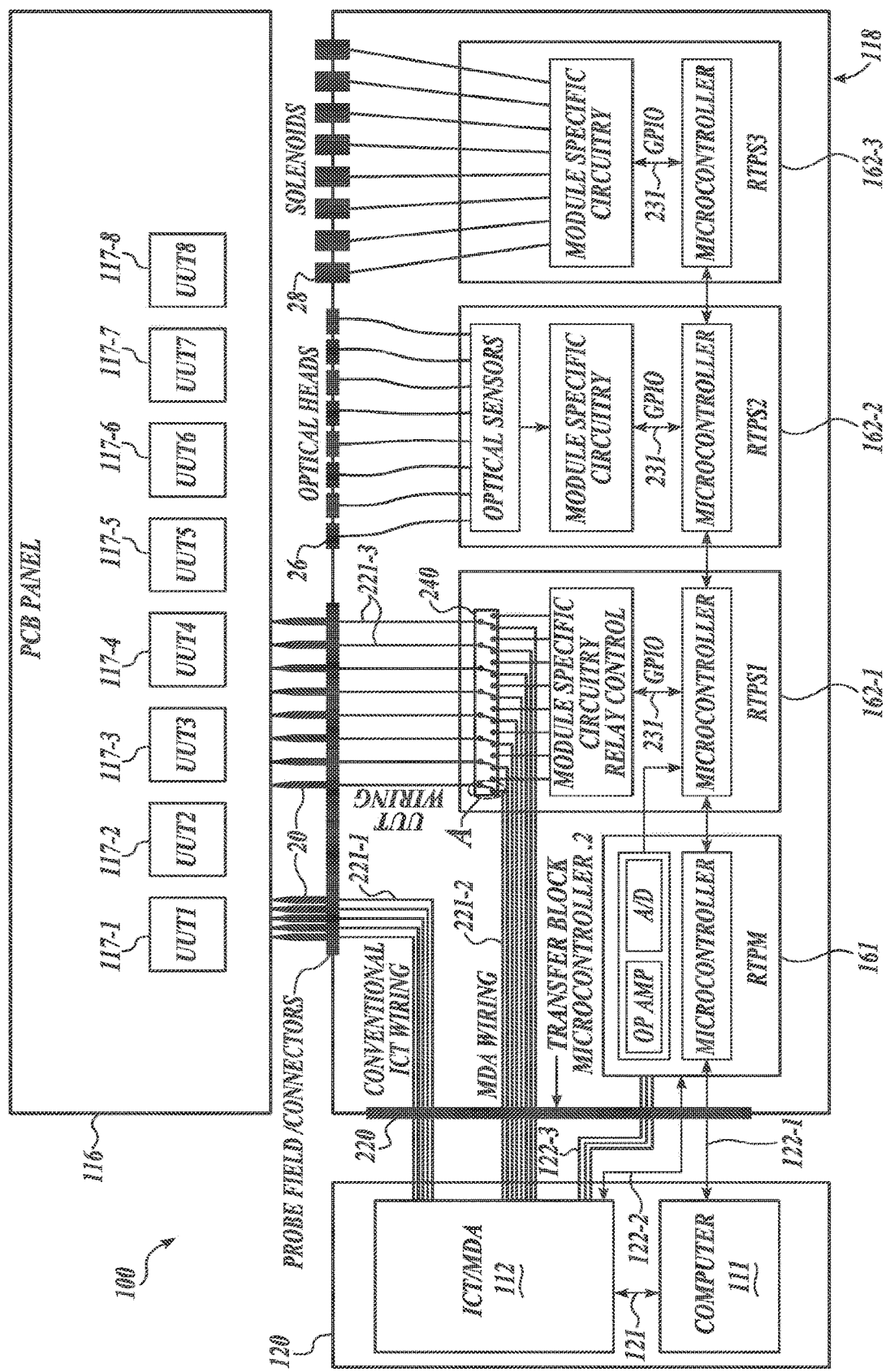
FIG. 4A is a block diagram of a PCB tester in accordance with an embodiment of the present technology.

FIG. 4A is a block diagram of a PCB tester in accordance with an embodiment of the present technology. The illustrated PCB tester 100 includes the control system 120 and the test fixture 118. Signals/power from the test fixture 118 to the UUTs 117 can be routed through contact pins 20, optical connections 26, solenoids 28, and/or wirelessly. In some embodiments, the control system 120 is connected to the test fixture 118 through a transfer block 220 (e.g., paired connectors suitable for high speed signals).

In some embodiments, the RTPM module 161 serves as a master device in the RTP bus chain, the RTPS modules 162 being attached-to and controlled-by the RTPM module 161. In some embodiments, during the power-on sequence for the test fixture 118 or when a bus reset is requested, the RTP modules undergo an auto-addressing phase to automatically detect how many RTPS modules 162 are included in the RTP chain, and what their respective positions are within the chain.

In some embodiments, the per-channel circuitry of the RTPS module is duplicated for each channel supported by the RTPS module. The channels of the RTPS module may be capable of operating independently from one other. The microcontroller firmware of the RTPS module may disable/enable the independent channels, or certain features could be applied to one enabled channel and not others. In some embodiments, the RTPS modules are capable of simultaneous (i.e., parallel) functional testing of multiple or all UUTs 117, therefore increasing the throughput of the PCB tester 100.

Shortened Distance Between Test Fixture and UUTs

With the conventional testers, a relatively long distance between the sources of the signals and the UUTs limits the signal frequency and/or power available for testing the UUTs. In some embodiments of the present technology, for example with high-speed testing of the UUTs 117, a signal sources on the RTPS modules 162 are located closer to the UUTs 117, therefore reducing issues that are caused by long transmission lines (e.g., degraded signal integrity).

The RTPS modules 162 may be designed to interface with and test multiple UUTs 117 connected to a channel (also referred to as a "data channel"). For example, the individual channels of the RTP module 162 may utilize one or more contact pins 20, optical connections 26, solenoids 28, and/or wireless connections to transfer signals to/from the UUTs 117. In many embodiments of the present technology, the distance between the RTPS modules 162 and the UUTs 117 is shortened because the RTPM/RTPS modules are carried by the test fixture 118.

Combined ICT/FT Test

In some embodiments, the tester 100 is configured to execute both the ICT and the FT. For example, for the ICT test, the ICT/MDA 112 can be wired directly through traces 222-1 to some of the contact pins 20. Other pins 20 in the ICT test may be connected to the ICT/MDA 112 through traces 222-2 and relays 240 of the RTPS modules 162. The relays 240 may be, for example, electromechanical or solid-state relays (e.g., banks of transistors). The relays may switch the UUTs 117 from ICT test (UUT test points directly connected to ICT/MDA 112) to functional test (UUT test points connected to the circuitry of RTPS 162), and vice versa.

In many embodiments, when ICT and FT are combined into one tester 100, the test flow is simplified and accelerated. Furthermore, if the ICT finds problems (e.g., shorts on the UUT), then the select relays may switch to isolate particular parts of the FT circuitry on the RTPS 162, therefore preventing damage to the RTPS modules 162.

Buses Connecting RTPM

In some embodiments, the RTPM 162 may be in communication with the controller 111 through a bus 122-1 (e.g., high speed serial bus) and in communication with the ICT/MDA 112 through a bus 122-2 (e.g., a serial or parallel bus, also referred to as a handshake connection). In some embodiments, the handshake connection 122-2 may be a parallel bus. When exchanging small amounts of data between the ICT/MDA system 120 and the RTPM 161, the handshake connection 122-2 may be more agile and faster than a nominally faster USB bus.

The RTPM 161 may also include one or more operational amplifiers (OP AMP) and analog to digital converters (A/D). The OP AMPs and A/Ds may be connected to the ICT/MDA 112 through an analog bus 122-3. For some relatively slow-speed UUT tests, for example, a DC test, the bus 122-3 may connect the A/D of the RTPM module to the UUTs through a bus 221-1 (also referred to as "conventional ICT wiring"), or through a bus 221-2 (also referred to as "MDA wiring") and further through the relay bank 240 and a bus 221-3 (also referred to as "UUT wiring").

Verification of Connectivity Between RTPS Modules and ICT/MDA

Figure 4B:
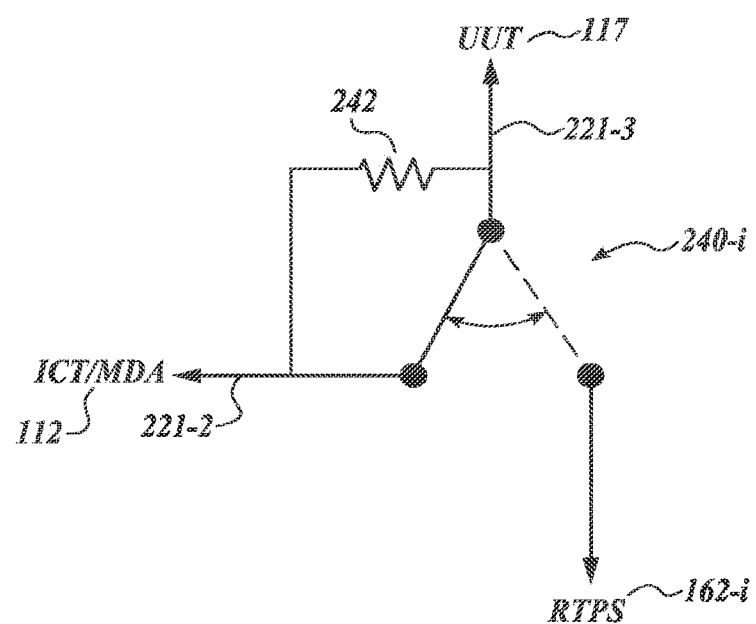
FIG. 4B shows detail A of FIG. 4A.

FIG. 4B shows detail A of FIG. 4A. In particular, the relay 240-i may connect the UUT 117 to either the RTPS module 162-i for the FT or to the ICT/MDA 112 for the ICT. In some embodiments, a resistor 242 is added in parallel with the relay's path to the ICT/MDA 117 to isolate the FT points from the loading capacitance of the wires coming from the ICT/MDA 112 (the wires of the bus 221-2). Additionally, a voltage drop can be measured from the UUT 117 to the ICT/MDA 112 even when the relay connects the UUT 117 with the RTPS 162. As a result, in at least some embodiments, the ICT/MDA 112 can determine if the connection from the RTPS to the UUT functions properly (e.g., no opens in the path). In many situations, in absence of the resistor 242, determination about the integrity of the connection from the RTPS to the UUT must be performed manually, resulting in higher cost and longer fixture development/debug times.

Vertically Stacked RTPM/RTPS Chains

Figure 4C:
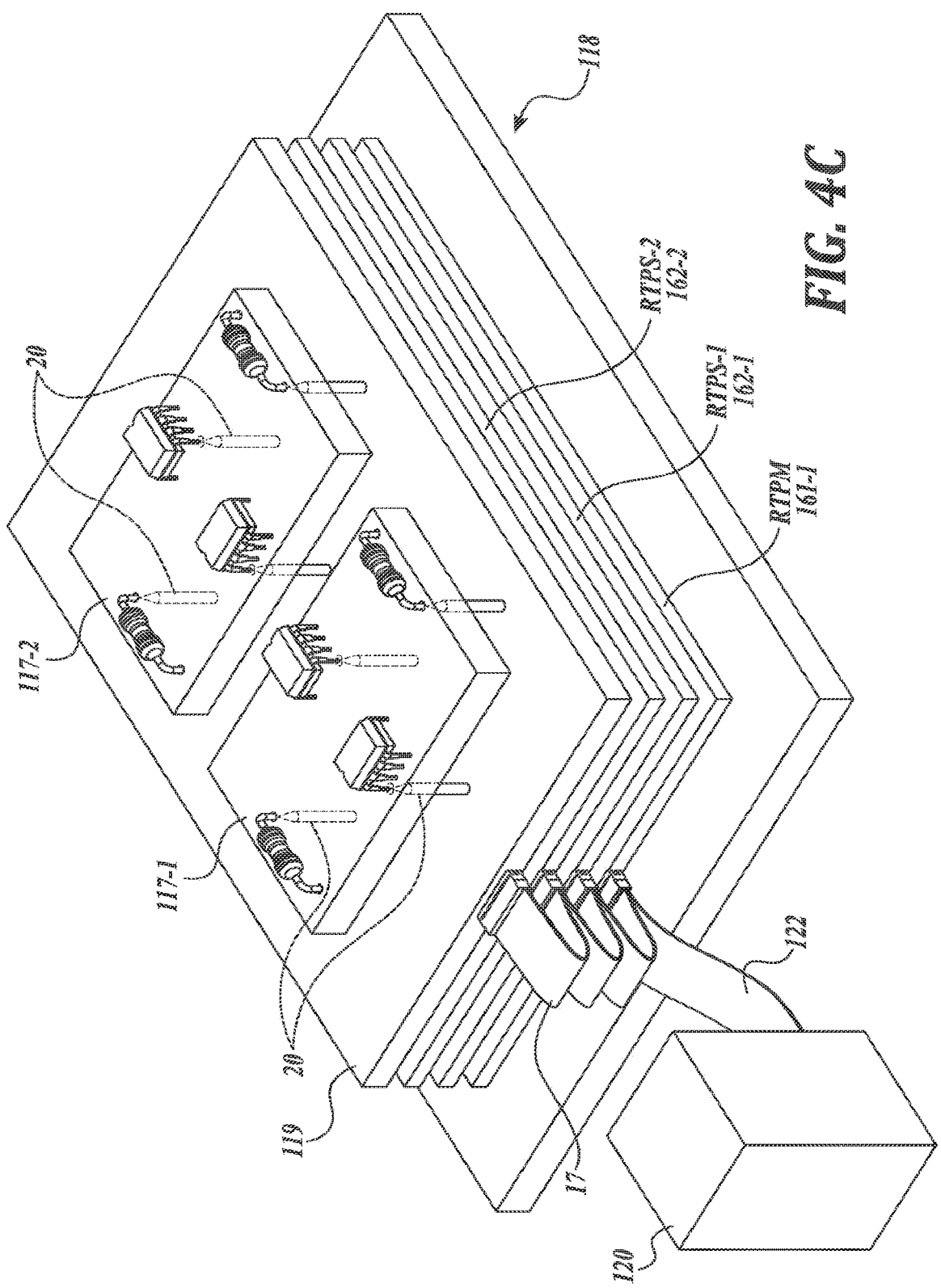
FIG. 4C is a partially schematic isometric view of a PCB tester in accordance with an embodiment of the present technology.

FIG. 4C is a partially schematic isometric view of a PCB tester in accordance with an embodiment of the present technology. In some embodiments, the test fixture 118 carries the RTPM/RTPS chain that is vertically stacked. For example, the RTPM module 161 may support one or more RTPS modules 162 in a vertical stack. The uppermost RTPS module 162 in the stack contacts a test interface 119 that supports the UUTs 117. In some embodiments, the contact pins 20 of the test interface 119 touch the test points of the UUTs 117 to establish electrical connectivity. The electrical connectivity may be established with mechanical pins, optical contacts, solenoids, or wireless connections. In some embodiments, vertical stacking of the RTPM/RTPS chain results in a more compact test fixture. Furthermore, a reduced distance between the RTPS modules and the UUTs decreases signal/power degradation because of the shortened electrical path from the RTPS modules to the UUTs.

FIG. 4D is a schematic view of RTP module mounting holes in accordance with an embodiment of the present technology. In some embodiments, the RTPMs and RTPSes may include a standardized distribution of mounting holes 172. For example, the rows and columns of the mounting holes 172 may be separated by standardized widths W and heights H. Suitable standoffs may maintain vertical offsets between individual RTPM/RTPS modules.

Figure 5:
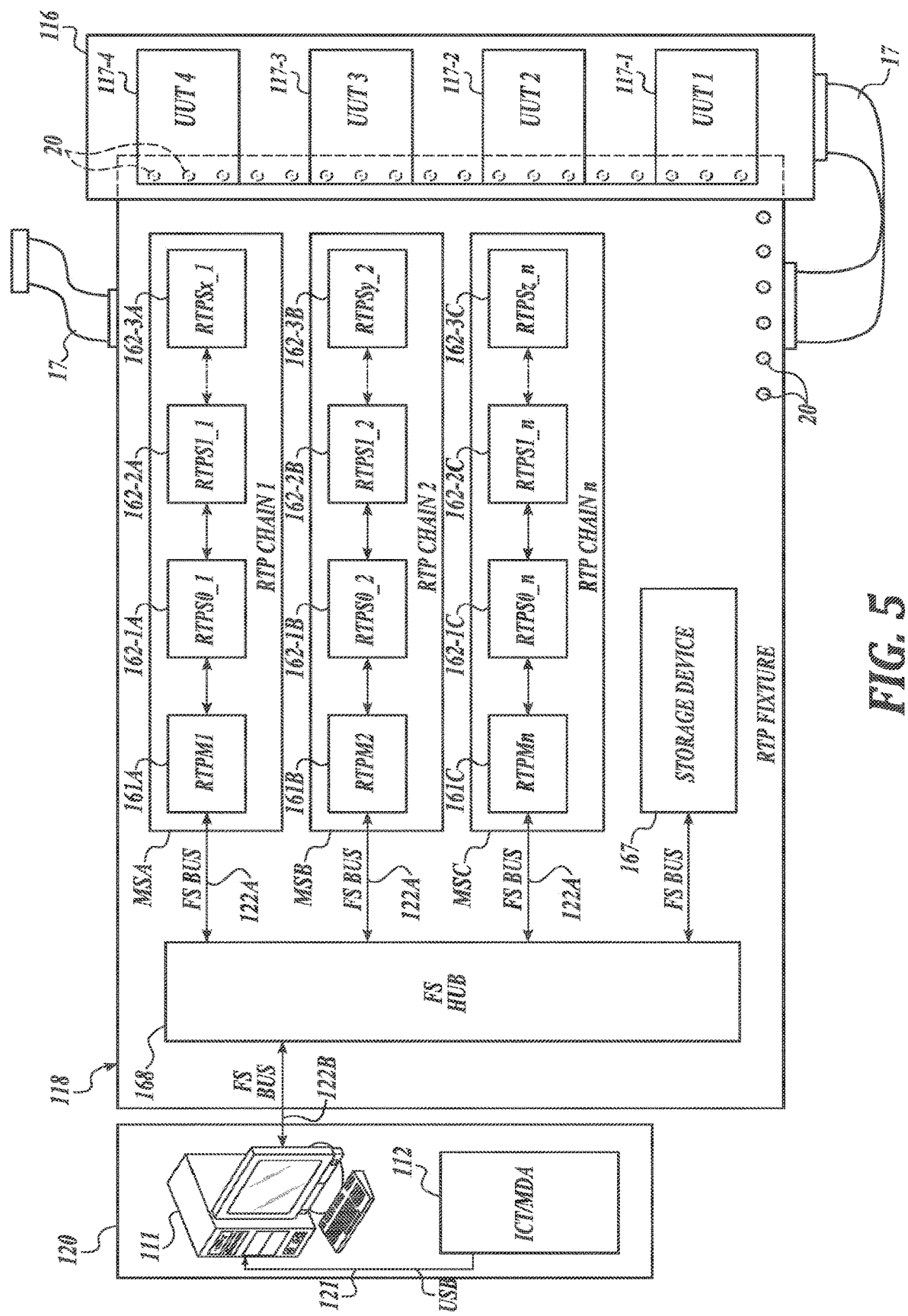
FIG. 5 is a block diagram of RTP master (RTPM) and RTP slave (RTPS) chain in accordance with an embodiment of the present technology.

FIG. 5 is a block diagram of RTPM/RTPS chains in accordance with an embodiment of the present technology. The illustrated RTPM/RTPS chains are individually connected to a fast serial hub 168 through a high speed serial bus 122A, and further to the control system 120 with a high speed serial bus 122B. In some embodiments, the high speed serial buses 122A/122B are USB buses. Multiple RTPM/RTPS chains in parallel may allow for a higher data throughput. For example, conventional functional tests are performed on one UUT at a time. As a result, with the conventional systems, time required to test the entire batch of the UUTs 117 generally corresponds to the time required for testing an individual UUT multiplied by the number of UUTs 117 in the UUT panel 116. In some embodiments of the present technology, a single RTPM/RTPS chain 161/162 can test multiple UUTs 117 in parallel. Additionally, multiple RTPM/RTPS chains may further increase the parallelism of the test. As a result, multiple UUTs 117 can undergo the same FT in the same time as it takes for one UUT 117. Such a capability may be useful for the test processes having strict takt time requirements.

In some embodiments, multiple RTP master/slave chains 161/162 can further increase throughput when, for example, the number of UUTs 117 is increased. For example, in some tests three RTPM/RTPS chains 161/162 may be configured to support testing of three UUTs in parallel. When a fourth UUT 117 is added to the parallel test, the resources of the existing three RTPM/RTPS chains 161/162 may be reconfigured to support testing of the fourth UUT without having to add additional RTPM/RTPS chains. In contrast with the embodiments of the inventive technology, the addition of another UUT requires adding dedicated test resources to conventional PCB testers.

In some embodiments, the test fixture 118 includes the memory storage device 167 for storing test programs, test pin assignments, test vectors, and/or other data for testing the UUTs 117. In some embodiments, the test fixture 118 communicates with the ICT/MDA 112 through the host controller 111.

Figure 6:
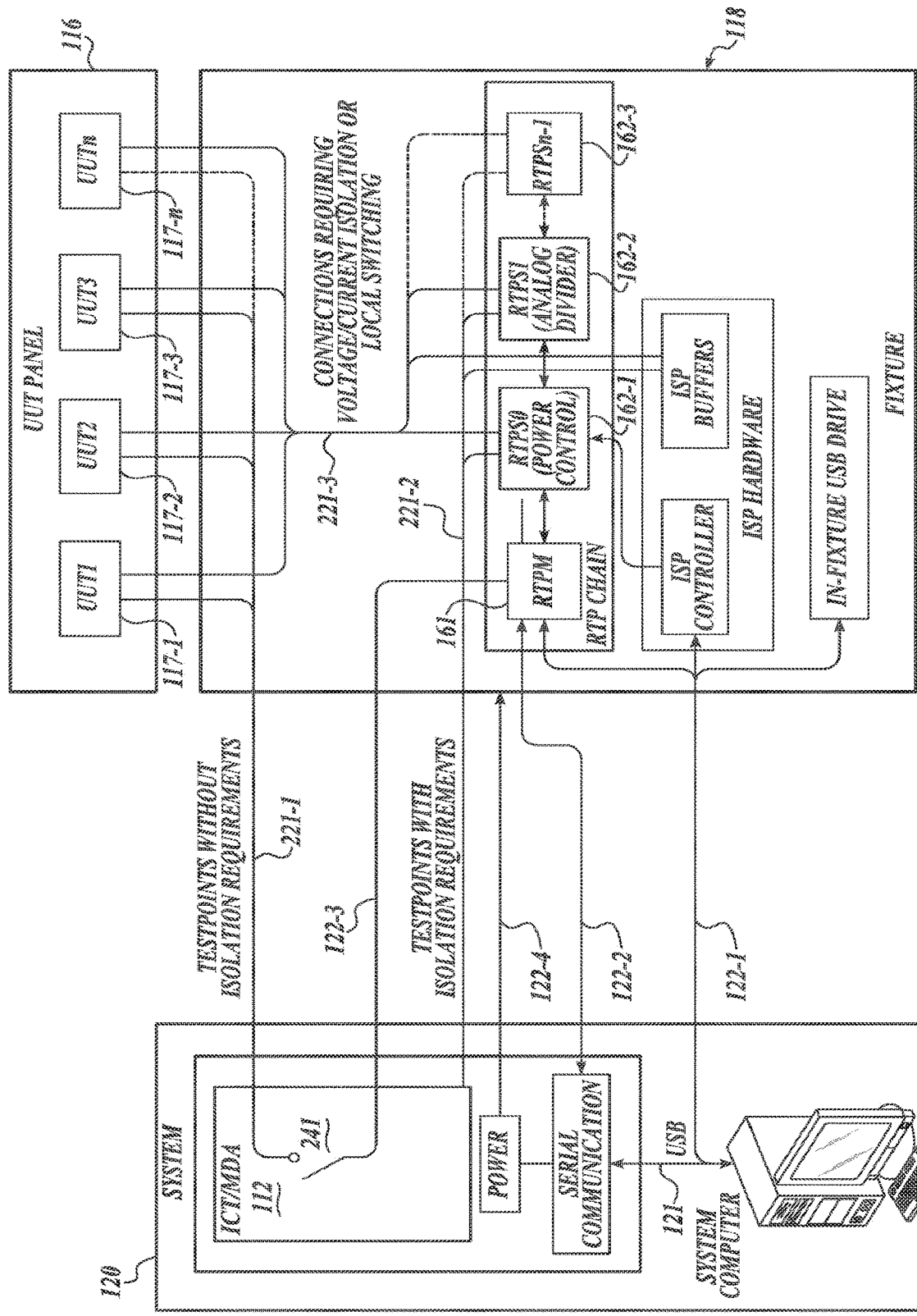
FIG. 6 is a block diagram of connections between a control system and a test fixture in accordance with an embodiment of the present technology.

FIG. 6 is a block diagram of connections between the control system 120 and the test fixture 118 in accordance with an embodiment of the present technology. In some embodiments, the control system 120 includes a relay switching matrix 241 that may be a solid relay switching matrix (e.g., a bank of transistors). Depending on the isolation requirements of the testpoints on the UUTs 117, the relay switching matrix 241 may connect the testpoints on the UUTs 117 to the RTPM/RTPS chain 161/162 without isolation or with isolation. For example, the relays may be closed to directly connect the testpoints on the UUTs 117 with the ICT/MDA 112 for the ICT (e.g., testing opens/ shorts, resistance measurements, etc.). Analogously, the UUT testpoints that are used in conjunction with FT may require isolation or local switching. In some embodiments, the test fixture 118 includes in-system programming (ISP) hardware, for example ISP controller and/or ISP buffers. In some embodiments, the ISP hardware may include Multi-Writer.

In some embodiments, the test fixture 118 may include RTPS modules 162 that include the functionality of power control (e.g., the RTPS 162-1) or analog divider (e.g., the RTPS 162-2). In some embodiments, the test fixture 118 includes RTPS modules with other functions, for example:

serial communication protocols (CAN, LIN, $I^2C$, $I^2S$, JTAG, SPI, UART, etc.);

power regulation (buck/boost regulators, linear regulators, load switches, discharge modules, function generators);

data sampling (frequency/timing, logic recording/playback);

optical applications (LED sensing, infrared transmission/detection, fiber optics);

power detection (DC/AC voltage/current sensing, HIPOT); and/or solenoid/relay control.

Figure 7:
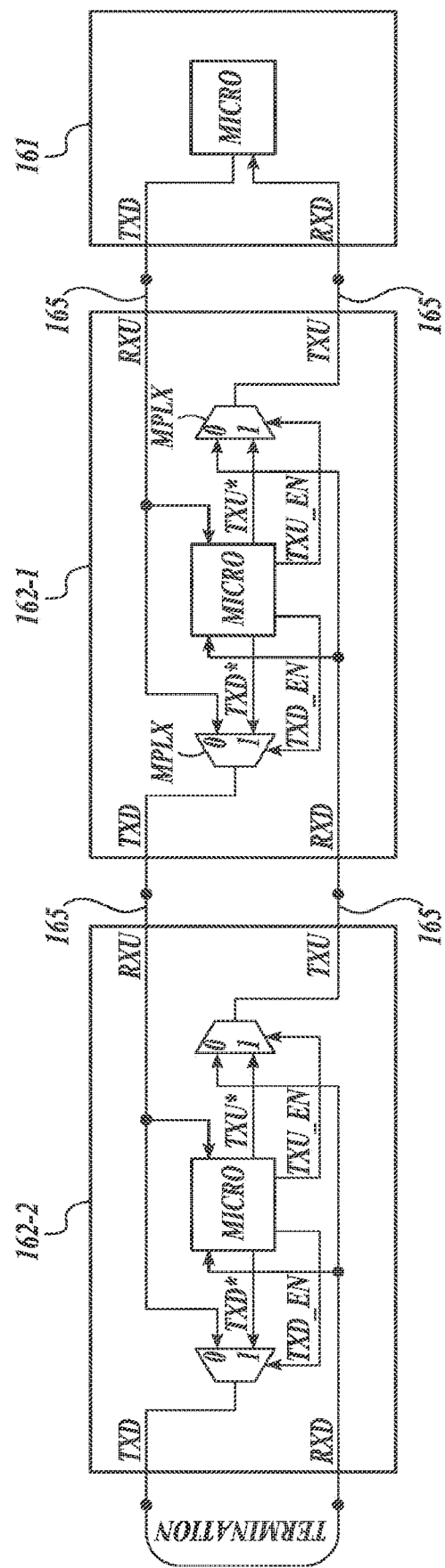
FIG. 7 is a block diagram of connections among RTPM and RTPS modules in accordance with an embodiment of the present technology.

FIG. 7 is a block diagram of connections among RTPM and RTPS modules in accordance with an embodiment of the present technology. The RTPM/RTPS modules 161/162 may be carried by the test fixture 118 (not shown). In some embodiments, the RTPM/RTPS modules 161/162 have their upstream ports connected ("chained") to the corresponding downstream ports through RTP bus 165. For example, a downstream transmitter node TXD of the RTPM module 161 may be chained to an upstream receiver node RXU of the RTPS module 162-1. As another example, a downstream receiver node RXD of the RTPS module 162-1 may be chained to an upstream transmitter node TXU of the RTPS module 162-2. On the upstream end of the RTPM/RTPS module chain, the RTPM module 161 has only the downstream nodes TXD/RXD for connecting with the rest of the chain. Analogously, on the downstream end of the RTPM/RTPS chain, a termination may be added to short the TXD to the RXD node of the RTPS module 162-2. In some embodiments, the RTPS module 162 may automatically detect which of the two ports is upstream or downstream, resulting in simpler chaining of the modules.

In operation, the RTPM module 161 may initiate communication over the RTP bus 165. In some embodiments, the RTPM and RTPS modules implement a common communication protocol, whereby the RTPM module can select and initiate commands, and transfer data to one or more RTPS modules. For example, the RTPM module 161 may communicate to the RTPS modules 162 to obtain information about the RTPS modules: the module board number and board revision, build revision number, communications driver version information, descriptions, and usage information about any of the supported command handler functions (parameter data, return data), and information about the number of output channels and respective header pins. The RTPM module 161 may also control the RTPS modules 162 to: modify communications settings, download error reporting information for RTP bus communication errors, perform a soft reset of the RTPS module, read from the device memory, manipulate the device memory, etc.

In some embodiments, the RTP bus is an 8-bit asynchronous serial bus. When the RTP modules are powered on, the RTPM module 161 may initiate a synchronization phase, during which the RTPS modules 162 are synchronized to the bus 165. The synchronization phase can force all devices on the RTP bus 165 into the same communication state. When this phase is completed, the RTPS modules 162 can start accepting command packets from the RTPM module 161, thereby the internal functions of the individual RTPS modules 162 become available to the RTPM module 161 and the controller 111.

In some embodiments, each RTPS module 162 includes two 2-bit multiplexers MPLX for outputting upstream TXU and downstream TXD signals. The multiplexers MPLX may be controlled by the signals TXD_EN and TXU_EN. Depending on the state of these two signals, the RTPS can be in one of the four modes described in Table 1 below.

TABLE 1

Communication modes based on multiplexer states

| TXD_EN | TXU_EN | Mode | Description |
| --- | --- | --- | --- |
| 0 | 0 | Pass-through Mode | The module is disabled from communicating upstream or downstream. The micro can still listen for messages coming from upstream or downstream. |
| 0 | 1 | Privileged upstream mode | The module can transmit upstream towards the RTPM, however cannot transmit downstream. |
| 1 | 0 | Privileged downstream mode | The module can transmit downstream, however cannot transmit upstream. |
| 1 | 1 | Full privileged mode | The module can transmit both upstream and downstream. |

Figure 8:
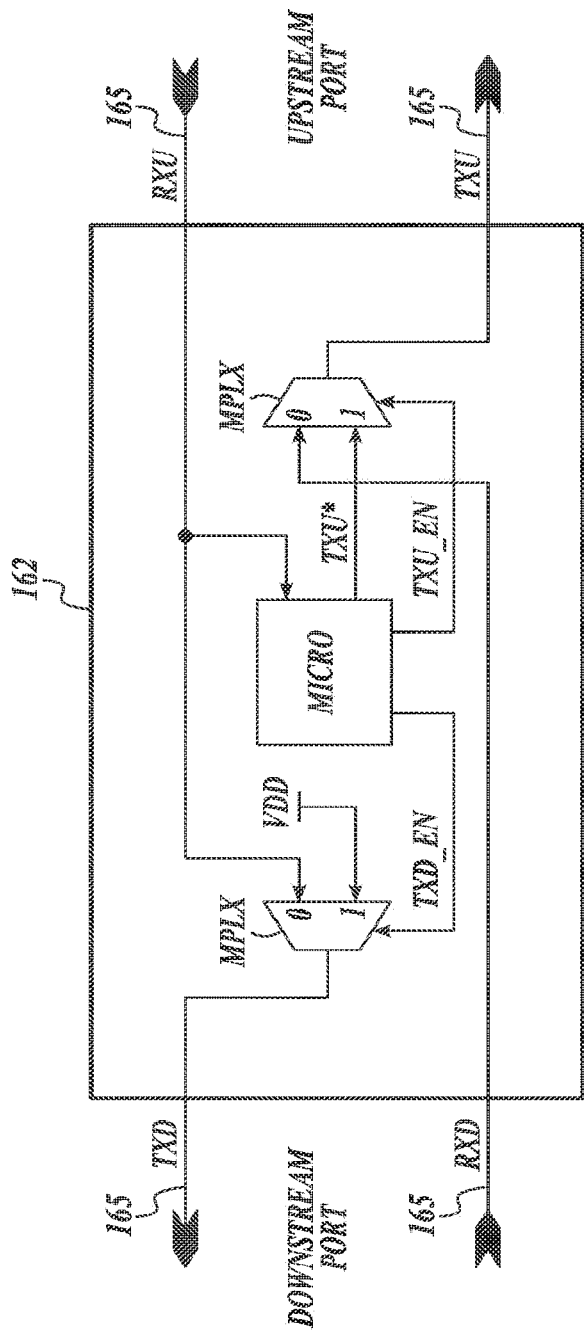
FIG. 8 is a block diagram of an RTPS module in accordance with an embodiment of the present technology.

FIG. 8 is a block diagram of the RTPS module 162 in accordance with an embodiment of the present technology. With the illustrated embodiment, a microcontroller MICRO is directly connected to fewer points on bus 165, because the microcontroller MICRO is not connected to the RXD and TXD ports any more. Instead, the RXD and TXD ports are connected to the multiplexers MPLX.

Figure 9:
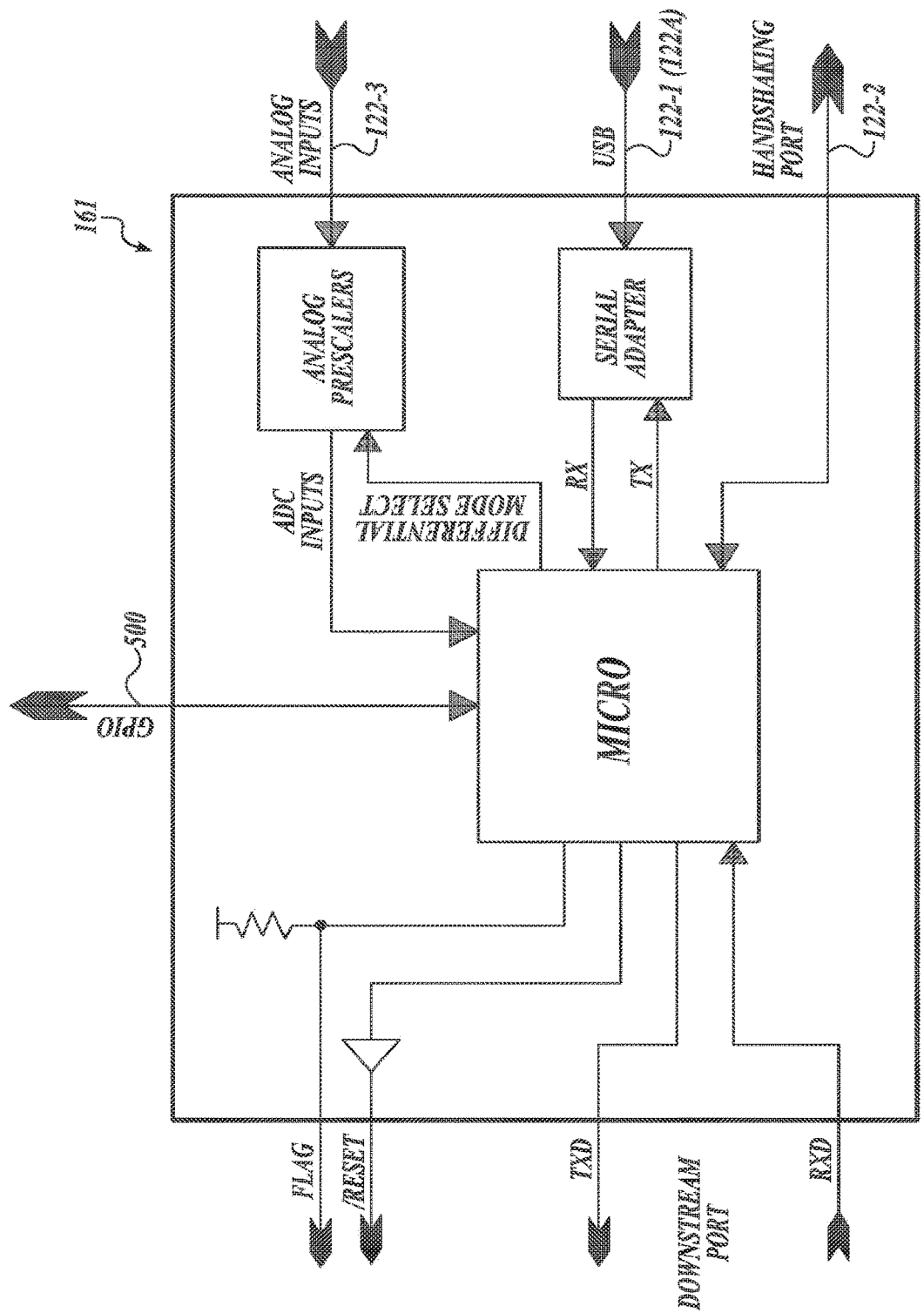
FIG. 9 is a block diagram of an RTPM module in accordance with an embodiment of the present technology.

FIG. 9 is a block diagram of an RTPM module 161 in accordance with an embodiment of the present technology. In some embodiments, the RTPM module 161 includes several inputs/outputs: analog input bus, USB input and handshaking signal port at its upstream side, and RTP bus TX/RX ports, flag (FLAG) and reset (RESET) ports on its downstream side.

The RESET port may drive a hard reset of the RTPS boards. In response, the RTP hardware is configured into a known reset state. The FLAG port may be pulled up by the RTPM module 161, and may be programmed as an interrupt request (IRQ) pin for coordinating tasks between RTPM/RTPS modules. In some embodiments, the FLAG pin also provides a conduit of passing control of RTPS module features to other electronics of the test fixture 118.

The RTPM module 161 may also include a general purpose input/output (GPIO) header 231 to provide access directly to port pins on the microcontroller MICRO. In some embodiments, the GPIO header 231 may be used for controlling in-fixture signals. In other embodiments, the GPIO header may be used for connections directly to the contact pins.

In some embodiments, the analog input port of the RTPM module 161 can be an 8-channel analog input port. For example, the analog input port may be configured to measure differential voltages or single-supply voltages.

In some embodiments, the RTPM module 161 is connected to the control system 120 via the USB port. The USB port may also provide power to the module.

Hardware Scan

On initialization, the RTPM module 161 may synchronize the RTPS modules 162 and may perform a full hardware scan of the devices contained on the RTP bus. The RTPM module may also collect information about the module part numbers, supported commands, and pin information, which can be stored in a memory (e.g., the memory storage device 167).

In some embodiments, the stored information may be used to check against test programs, and can be used to detect proper hardware configuration and proper functions of the test fixture 118. Furthermore, the RTPM software may store a hash of the RTPS in-memory data, to be used to verify that the test fixture 118 includes the proper hardware and firmware during the run of any test program.

In some embodiments, the hardware scan compares configurations of the RTPM/RTPS modules in the fixture to the hardware listing in the specification file. In general, if differences between the real and expected hardware configurations are detected, the scan fails. The hardware scan may also provide a list of detected hardware differences to the operator. In some embodiments, an operator may load description of the expected hardware from a file. In some embodiments, the detected hardware configuration is saved as a hardware descriptor in a dedicated file.

Figure 10:
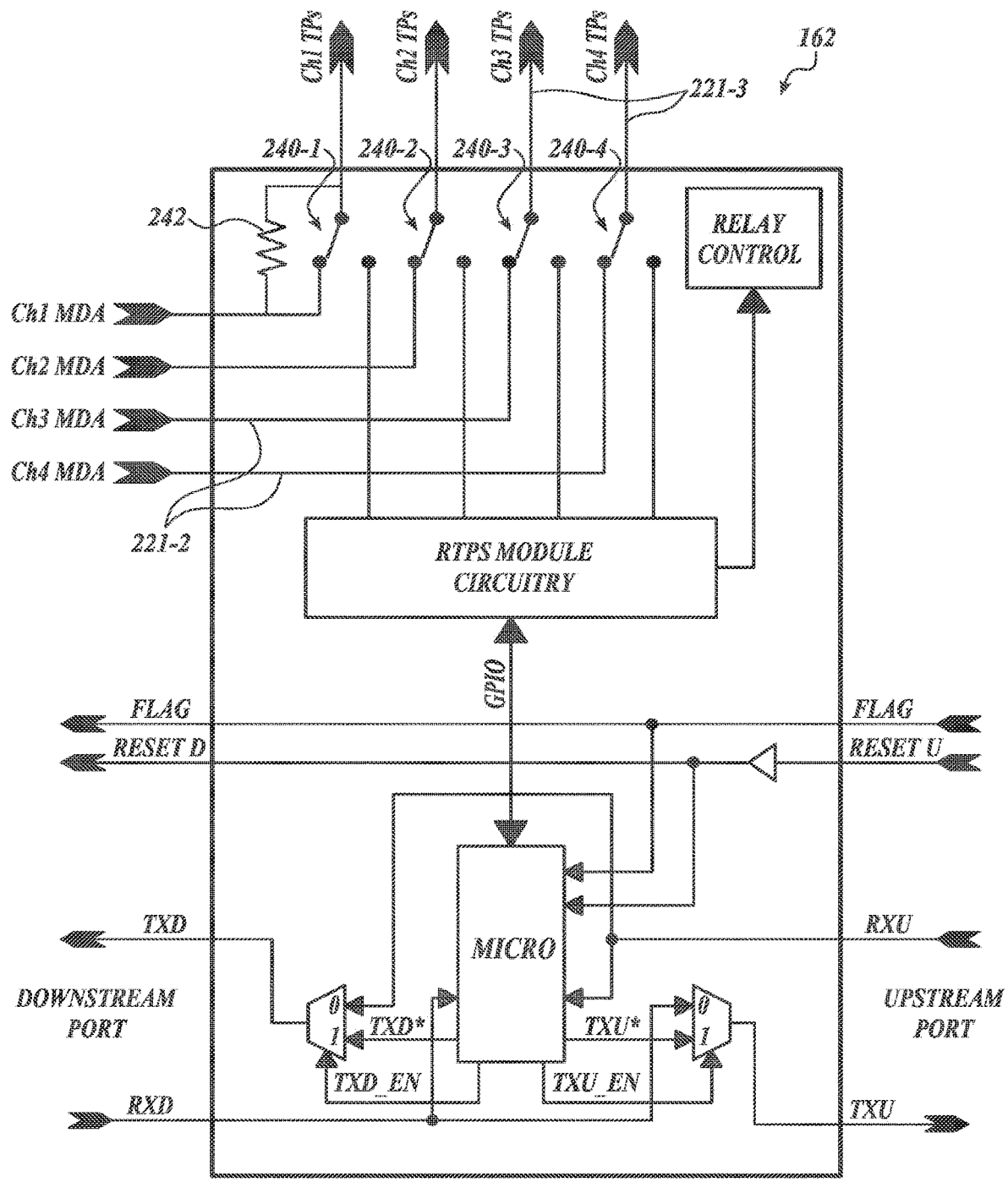
FIG. 10 is a block diagram of an RTPS module in accordance with an embodiment of the present technology.

FIG. 10 is a block diagram of an RTPS module 162 in accordance with an embodiment of the present technology. In some embodiments, the RTPS module 162 may be powered from a DC power supply using, for example, a 12V power connector. Additionally, the RTPS module 162 may include DC-to-DC converters to provide power for the on-board electronics. The operation of the upstream and downstream port connectors, the RESET pin, and the FLAG pin may be similar to those described with reference to FIGS. 8 and 9.

In some embodiments, the RTPS module 162 includes module-specific circuitry that is tailored for each RTPS variant to facilitate specific function of that module (e.g., output buffers, voltage translators, transceivers, etc.). The RTPS module 162 may include multiple test channels (Ch1 TPs, CH2 TPs, etc.) for testing one or more UUTs 117. In some embodiments, the circuitry on the RTPS module 162 is duplicated for each test channel supported. The contact pins 20 may be assigned to the individual test channels (Ch1 TPs, CH2 TPs, etc.) of the UUT.

In some embodiments, the RTPS module 162 may use a communications driver to control an upstream and downstream TX/RX ports, and process telegrams transmitted over those ports. The RTPS module 162 may also control its own functions, for example, control an SPI or I2C device, turn on or off timer or pin edge/level detection interrupts, toggle various GPIO pins high or low, read the states of GPIO pins or on-chip ADCs, coordinate measurements with other RTPS modules, reprogram the RTPS module firmware, and/or perform self-test routines.

From the foregoing, it will be appreciated that specific embodiments of the technology have been described herein for purposes of illustration, but that various modifications may be made without deviating from the disclosure. Moreover, while various advantages and features associated with certain embodiments have been described above in the context of those embodiments, other embodiments may also exhibit such advantages and/or features, and not all embodiments need necessarily exhibit such advantages and/or features to fall within the scope of the technology. Accordingly, the disclosure can encompass other embodiments not expressly shown or described herein.

The invention claimed is:

1. A tester for printed circuit boards (PCBs), comprising:
   a test fixture having a plurality of electrical contacts for contacting the PCBs that are units under test (UUTs), wherein the test fixture carries:
      a remote test peripheral master (RTPM) module, and
      a remote test peripheral slave (RTPS) module, wherein the RTPM module and the RTPS module are connected through a remote test peripheral (RTP) serial bus, and wherein the RTPM module is configured for communicating with the UUTs exclusively through the RTPS module,
   a control system that is separate from the test fixture, wherein the test fixture is connected with the control system through a high speed serial bus that is separate from the RTP serial bus.

2. The tester of claim 1, wherein the RTPS module is a first RTPS module, the tester further comprising a second RTPS module in communication with the first RTPS module.

3. The tester of claim 2, wherein the RTPM module is a first master module, the first RTPS module belongs to a first plurality of RTPS modules, and the RTP serial bus is a first RTP serial bus, the tester further comprising:
   a second RTPM module, and
   a second plurality of RTPS modules, wherein the second RTPM module and the second plurality of RTPS modules are connected through a second RTP serial bus.

4. The tester of claim 3, wherein the first RTPM module and the first plurality of the RTPS modules are vertically stacked in a first stack, and wherein the second RTPM module and the second plurality of the RTPS modules are vertically stacked in a second stack.

5. The tester of claim 1, further comprising a control system that includes:
   an in-circuit tester and manufacturing defects analyzer (ICT/MDA), and
   a host controller.

6. The tester of claim 5, further comprising a plurality of relays connecting the ICT/MDA with the RTPS module.

7. The tester of claim 5, further comprising a high speed serial hub configured to route data between the RTPM module and the host controller.

8. The tester of claim 1, wherein the RTP bus is an 8-bit asynchronous serial bus.

9. The tester of claim 1, further comprising at least one UUT electrically connected to the test fixture through a plurality of contact pins.

10. The tester of claim 1, further comprising at least one UUT optically or wirelessly connected to the test fixture.

11. The tester of claim 1, further comprising a memory device configured to store test point information and test programs.

12. A method for testing printed circuit boards (PCBs) that are units under test (UUTs), the method comprising:
   establishing a data channel between a remote test peripheral slave (RTPS) module and at least one UUT;
   establishing a control channel between a remote test peripheral master (RTPM) module and the RTPS module through a remote test peripheral (RTP) serial bus, wherein the RTPM module and the RTPS module are carried by a test fixture, and wherein the RTPM module is configured for communicating with the UUTs exclusively through the RTPS module;

applying test program to the at least one UUT;

collecting test data by the RTPS module, wherein the test data are generated in response to applying the test program to the UUT; and sending test data to a host controller of a control system through a high speed serial bus that is separate from the RTP serial bus, wherein the control system is separate from the test fixture.

13. The method of claim 12, wherein the RTPS module is a first RTPS module in a master/slave chain, and wherein the master/slave chain includes a plurality of RTPS modules, the method further comprising:

controlling the plurality of RTPS modules by the RTPM module through the control channel.

14. The method of claim 13, further comprising:

comparing, by at least one RTPS module, returned test data with expected return values, and based on comparing, determining a pass/fail condition of the UUTs.

15. The method of claim 12, wherein the test program executes a functional test (FT), and wherein the data channel is a first data channel, the method further comprising:

establishing a second data channel between an in-circuit tester and manufacturing defects analyzer (ICT/MDA) and the UUT; and running in-circuit test on the UUT.

16. The method of claim 15, further comprising:

connecting the UUT with the ICT/MDA through a plurality of relays when the plurality of relays are in a first position, and connecting the UUT with the RTPS module when the plurality of relays are in a second position.

17. The method of claim 12, further comprising:

in response to a query from the RTPM module, reporting a configuration of the RTPS module to the RTPM module.

18. The method of claim 12, further comprising:

running a self-diagnostics by the RTPS module; and reporting the results of the self-diagnostics to the RTPM module.

19. The method of claim 18, wherein the results of the self-diagnostics of the test module include at least one of an erroneous wiring, a hardware failure, or a power issue.

20. The method of claim 12, wherein the test program is stored on a memory storage device carried by the test fixture.

21. The method of claim 20, further comprising initiating an execution of the test program by the RTPM module.

22. The method of claim 12, wherein multiple UUTs are tested in parallel.

23. The method of claim 22, wherein the UUTs have different designs.

* * * * *